United States Patent
Rimbert-Riviere et al.

(10) Patent No.: US 10,141,199 B2
(45) Date of Patent: Nov. 27, 2018

(54) SELECTING A SUBSTRATE TO BE SOLDERED TO A CARRIER

(71) Applicant: Infineon Technologies AG, Neubiberg (DE)

(72) Inventors: Charles Rimbert-Riviere, Soest (DE); Jean-Laurent Deborde, Dortmund (DE); Martin Haller, Altdorf (DE); Nils Alexander Sanetra, Soest (DE); Vasile Vartolomei, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 266 days.

(21) Appl. No.: 15/251,058

(22) Filed: Aug. 30, 2016

(65) Prior Publication Data

US 2017/0062241 A1    Mar. 2, 2017

(30) Foreign Application Priority Data

Aug. 31, 2015 (DE) .......................... 10 2015 114 521

(51) Int. Cl.
*B23K 1/19* (2006.01)
*H01L 21/48* (2006.01)
(Continued)

(52) U.S. Cl.
CPC ........ *H01L 21/4882* (2013.01); *B23K 1/0016* (2013.01); *B23K 1/19* (2013.01);
(Continued)

(58) Field of Classification Search
CPC . H01L 2924/00014; H01L 2224/05599; H01L 2224/45099; H01L 21/4882;
(Continued)

(56) References Cited

U.S. PATENT DOCUMENTS 5,461,774 A     10/1995  Holmes et al.
6,803,653 B1 *  10/2004  Likins .................... H01L 23/36
                                                      257/666
(Continued)

FOREIGN PATENT DOCUMENTS

EP       1345480 A2       9/2003
JP       2000150741 A  *  5/2000
JP       2006245437 A     9/2006

*Primary Examiner* — Kiley S Stoner
*Assistant Examiner* — Carlos J Gamino
(74) *Attorney, Agent, or Firm* — Murphy, Bilak & Homiller, PLLC

(57) ABSTRACT

A method for soldering an insulating substrate onto a substrate mounting portion of a carrier by a predefined solder is provided. The insulating substrate includes a dielectric insulation carrier, a top side, and a bottom side opposite to the top side. The method includes selecting the insulating substrate based on a criterion which indicates that the insulating substrate, if it has the solidus temperature of the solder, has a positive unevenness. The insulating substrate is soldered on the bottom side to the substrate mounting portion, such that, after the soldering, the solidified solder extends continuously from the bottom side of the insulating substrate as far as the substrate mounting portion. The top side of the insulating substrate is populated with at least one semiconductor chip.

14 Claims, 2 Drawing Sheets

(51) Int. Cl.
*B23K 1/00* (2006.01)
*H01L 23/373* (2006.01)
*H01L 23/00* (2006.01)
*B23K 103/00* (2006.01)
*B23K 101/40* (2006.01)
*B23K 103/12* (2006.01)
*B23K 103/18* (2006.01)

(52) U.S. Cl.
CPC .......... *H01L 23/3735* (2013.01); *H01L 24/48* (2013.01); *H01L 24/85* (2013.01); *B23K 2201/40* (2013.01); *B23K 2203/12* (2013.01); *B23K 2203/18* (2013.01); *B23K 2203/52* (2015.10); *H01L 2224/48227* (2013.01); *H01L 2224/48472* (2013.01); *H01L 2224/85205* (2013.01); *H01L 2924/00014* (2013.01); *H01L 2924/1203* (2013.01); *H01L 2924/1301* (2013.01); *H01L 2924/13055* (2013.01); *H01L 2924/13062* (2013.01); *H01L 2924/13091* (2013.01); *H01L 2924/3511* (2013.01)

(58) Field of Classification Search
CPC . H01L 2224/48227; H01L 2224/48472; H01L 2224/85205; H01L 23/3735; H01L 24/48; H01L 24/85; H01L 2924/1203; H01L 2924/1301; H01L 2924/13055; H01L 2924/13062; H01L 2924/13091; H01L 2924/3511; B23K 1/0016; B23K 1/19; B23K 2201/40; B23K 2203/12; B23K 2203/18; B23K 2203/52
See application file for complete search history.

(56) References Cited

U.S. PATENT DOCUMENTS 9,818,614 B2* 11/2017 Gaudin .................. H01L 21/187
2016/0254209 A1* 9/2016 Oohiraki ............... H01L 23/473
257/707

* cited by examiner

SELECTING A SUBSTRATE TO BE SOLDERED TO A CARRIER

PRIORITY CLAIM

This application claims priority to German Patent Application No. 10 2015 114 521.9 filed on 31 Aug. 2015, the content of said application incorporated herein by reference in its entirety.

TECHNICAL FIELD

The present invention relates to a method for soldering an insulating substrate onto a carrier.

BACKGROUND

Insulating substrates are often used as circuit carriers for electrical circuits and, for example in order to produce a power semiconductor module, are soldered onto a carrier by means of a large-area soldered connection. In general, the insulating substrates are joined together from two or more component parts. Depending on the course of the joining process in question and the (generally different) coefficients of thermal expansion of the component parts, the circuit carrier may have a temperature-dependent curvature which is predictable only with difficulty. Two substrates of identical structure could exhibit a different temperature-dependent curvature behavior even when they were supposedly produced by the same production method and with the same process parameters and accordingly should in actual fact exhibit an identical temperature-dependent curvature behavior. The unpredictability of the temperature-dependent curvature behavior has the effect that the thickness or the thickness distribution of the solder used for soldering the insulating substrate onto the carrier is also not predictable. This can have the effect, for example, that the solder has a locally increased thickness in a region in which the circuit carrier is populated with a power semiconductor chip. This is associated with a locally increased thermal contact resistance between the insulating substrate and the carrier, this being disadvantageous if the process heat which arises in the power semiconductor chip is to be dissipated via the insulating substrate and the solder to the carrier.

If a solder layer with a greatly inhomogeneous thickness distribution was considered to be disadvantageous for a specific structure, an examination by X-ray was required following production of the joint, this being associated with a high level of expenditure. If the examination established an excessively inhomogeneous thickness distribution of the solder layer, it was necessary to dispose of, or expensively refurbish, the assembly comprising the carrier and the insulating substrate, and if appropriate also comprising electronic components with which the insulating substrate is populated.

SUMMARY

A method is provided for soldering an insulating substrate onto a carrier which, compared to conventional methods, leads to fewer rejects caused by a greatly inhomogeneous thickness distribution of the produced solder layer. The method includes soldering an insulating substrate onto a substrate mounting portion of a carrier.

According to an embodiment, a method for soldering an insulating substrate onto a substrate mounting portion of a carrier by a predefined solder is provided. The insulating substrate comprises a dielectric insulation carrier, a top side, and a bottom side opposite to the top side. In the method, the insulating substrate is selected based on a criterion which indicates that the insulating substrate, if it has the solidus temperature of the solder, has a positive unevenness. The insulating substrate is soldered on the bottom side to the substrate mounting portion, such that, after the soldering, the solidified solder extends continuously from the bottom side of the insulating substrate as far as the substrate mounting portion. The top side of the selected insulating substrate is populated with at least one semiconductor chip.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3 shows a cross section through the carrier, the insulating substrate, and through a solder located therebetween before the soldering-on.

FIG. 5 shows a graph with two curves, which shows the unevenness when passing through a temperature cycle both for an insulating substrate suitable for soldering on and for an insulating substrate unsuitable for soldering on.

DETAILED DESCRIPTION

Figure 1:
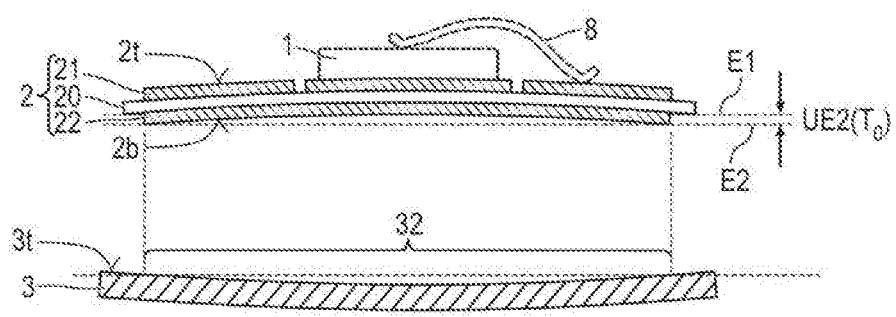
FIG. 1 shows a cross section through a carrier and an insulating substrate which is to be soldered thereonto and which has a negative unevenness.

FIG. 1 shows a cross section through a carrier 3 and an insulating substrate 2 to be soldered thereonto. By way of example, the carrier 3 can have the form of a planar or virtually planar plate. The carrier 3 has a top side 3t with a substrate mounting portion 32, onto which the insulating substrate 2 is later soldered.

The thickness of the carrier 3 can lie in the range of 2 mm to 5 mm, for example. Lower or higher values are similarly possible, however. By way of example, the carrier 3 can consist of metal or of a metal matrix composite material (MMC material). Suitable materials for a carrier 3 consisting of metal are, for example, copper, a copper alloy, aluminum or an aluminum alloy. It is similarly possible, for example, for the carrier 3 to comprise a carrier layer, which consists for example of copper, a copper alloy, aluminum, an aluminum alloy or another metal, and which, to improve the solderability, is provided with a thin coating, that side of which which is remote from the carrier layer forms or comprises the substrate mounting portion 32. Suitable materials for the coating for improving the solderability are, for example, nickel, silver, gold, palladium. Such a coating can be applied to the carrier layer by means of electroplating, by means of sputtering or by vapor deposition, for example.

The insulating substrate 2 comprises a dielectric insulation carrier 20, which is configured as a flat lamina and which has a top main surface and a bottom main surface opposite to the latter. An upper metalization layer 21 is applied to the top main surface of the insulation carrier 20 and can optionally be structured to form conductor tracks and/or conductor areas. Moreover, an optional lower metalization layer 22, which is unstructured but alternatively can also be structured, is applied to the bottom main surface of the insulation carrier 20. That side of the upper metalization layer 21 which is remote from the insulation carrier 20 forms the top side 2t of the insulating substrate 2. If a lower metalization layer 22 is present, that side thereof which is remote from the insulation carrier 20 forms the bottom side 2b of the insulating substrate 2. The top side 2t generally represents the component side of the insulating substrate 2 (i.e. that side which is already populated with one or more electronic components and/or that side which is still to be populated with one or more electronic components), and the bottom side 2b of the insulating substrate 2 is opposite to the top side 2t.

The metalization layers 21 and 22 are connected to the insulation carrier 20 in a fixed and integral manner. In particular, the upper metalization layer 21 can be connected to the insulation carrier 20 in a fixed and integral manner over its entire side facing toward the insulation carrier 20. Correspondingly, the lower metalization layer 22 can also be connected to the insulation carrier 20 in a fixed and integral manner over its entire side facing toward the insulation carrier 20, The insulation carrier 20 has an electrically insulating action. By way of example, it can consist of a ceramic material, e.g. aluminum nitride (AlN), aluminum oxide (Al2O3), silicon nitride (Si3N4), silicon carbide (SiC) or beryllium oxide (BeO). By way of example, the upper metalization layer 21 and the lower metalization layer 22 can consist of copper, a copper alloy, aluminum or an aluminum alloy, According to one example, the insulating substrate 2 may be a DCB (direct copper bonded) substrate, in which the upper metalization layer 21 and—if present—the lower metalization layer 22 are produced by connecting prefabricated, superficially oxidized copper films to a ceramic insulation carrier 20, for example consisting of aluminum oxide, b the DCB process.

FIG. 1 shows the carrier 3 and the insulating substrate 2 at an initial temperature $T_0$, for example at room temperature (20° C.). At the initial temperature $T_0$, the insulating substrate 20 may have a negative unevenness UE2($T_0$). In this context, the UE2 of the insulating substrate 20 is negative if—as shown in FIG. 1—it is concavely curved on its bottom side 2b. In this case, if a lower metalization layer 22 is present, the bottom side 2b of the insulating substrate 2 is provided by that side of the lower metalization layer 22 which is remote from the insulation carrier 20. If no lower metalization layer 22 is present, the bottom side 2b is provided by that side of the insulation carrier 20 which is remote from the upper metalization layer 21. If the insulating substrate 2 were alternatively to be convexly curved on its bottom side 2b, the unevenness UE2 thereof would be positive. Irrespective of whether the unevenness UE2 of the insulating substrate 2 is positive or negative, the extent of the unevenness UE2 is given by the smallest possible distance between two parallel planes E1 and E2, between which the bottom side 2b can extend adjacent both to the plane E1 and to the plane E2 without intersecting either of planes E1 and E2, As can likewise be gathered from FIG. 1, the carrier 3, as is also the case in all of the other configurations of the invention, can optionally be concavely curved in the region of the substrate mounting portion 32.

Figure 2:
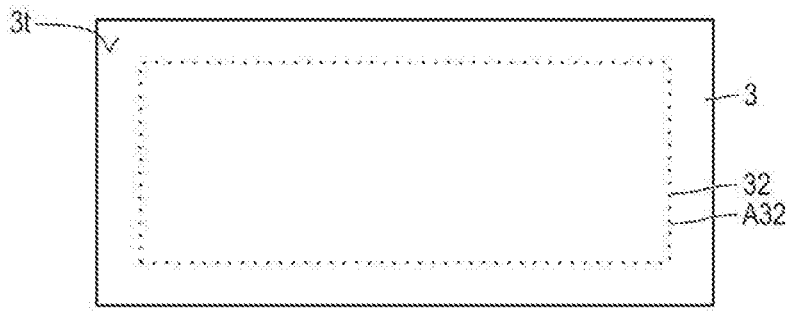
FIG. 2 shows a plan view onto that side of the carrier which comprises the substrate mounting portion.

FIG. 2 shows a plan view onto the top side 3t of the carrier 3, which comprises the predefined substrate mounting portion 32. The position of the substrate mounting portion 32 is illustrated by a dotted box. The substrate mounting portion 32 can have an area A32 of at least 6 cm², for example.

Figure 3:
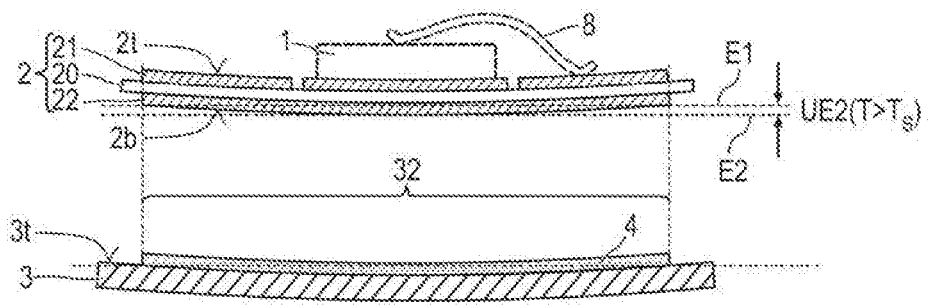

In order to solder the insulating substrate 2 onto the substrate mounting portion 32, use is made of a solder 4, as illustrated in FIG. 3. The solder 4 can be in the form of soft solder and may have a liquidus temperature $T_L$ of lower than 450° C. To perform the soldering-on, the solder 4 is introduced between the bottom side 2b of the insulating substrate 2 and the substrate mounting portion 32. By way of example, the solder 4 can be present as a paste which is applied to the substrate mounting portion 32 and/or to the bottom side 2b3. Similarly, the solder 4 can also be in the form of a prefabricated solder lamina ("preform solder") placed onto the substrate mounting portion 32. In principle, the soldering-on process can be effected using any desired soldering method. By way of example, the soldering-on process can be effected at negative pressure (i.e. a pressure which is reduced compared to the surrounding atmosphere), for example at an absolute pressure of less than 400 hPa, in order to avoid the formation of voids.

In any case, the solder 4 for soldering-on is heated up to above its liquidus temperature $T_L$, such that it melts. Given a liquid solder 4, the insulating substrate 2 is pressed by its own weight and/or a low external contact pressure in the direction of the substrate mounting portion 32, such that the liquid solder 4 extends continuously from the bottom side 2b as far as the substrate mounting portion 32. Then, the solder 4 is cooled to below its solidus temperature $T_S$, as a result of which it solidifies and connects the insulating substrate 2 to the substrate mounting portion 32 and therefore to the carrier 3 in an integral manner. The solidified solder 4 also extends continuously from the bottom side 2b as far as the substrate mounting portion 32.

Figure 4:
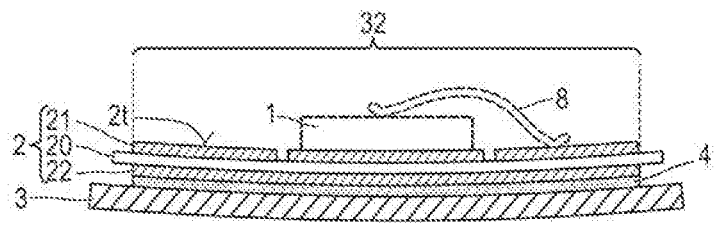
FIG. 4 shows a cross section through the carrier, the insulating substrate, and through the solder, which connects the carrier and the insulating substrate in an integral manner.

FIG. 4 shows the insulating substrate 2 soldered onto the substrate mounting portion 32. For the purposes of the present invention, the solidus temperature $T_S$ of the solder 4 is considered to be the solidus temperature $T_S$ of the solder 4 as such. That is, for the purposes of the present invention, the solidus temperature $T_S$ of the solder 4 does not change when material diffuses from the insulating substrate 2 and/or from the carrier 3 into the solder 4 during the soldering of the insulating substrate 2 to the carrier 3.

During the soldering-on process, or just before it, the insulating substrate 2 can be heated to a temperature T which is higher than the solidus temperature $T_S$ of the solder 4. This is illustrated by way of example in FIG. 3.

In the case of the example shown in FIG. 3, the insulating substrate 2 was preheated, i.e. it was heated to a temperature T above the solidus temperature $T_S$ of the solder 4 or even above the liquidus temperature $T_L$ of the solder 4, before it was brought into contact with the solder 4. Alternatively, however, it is also possible to firstly bring the insulating substrate 2 into contact with the still solid solder 4, and only then to heat it to a temperature T above the solidus temperature $T_S$ of the solder 4 or even above the liquidus temperature $T_L$ of the solder 4.

As is furthermore shown in FIG. 3, the insulating substrate 2 can have a positive unevenness UE2 at higher temperatures T, for example at temperatures T above the solidus temperature $T_S$ of the solder 4, i.e. UE2>0. If the insulating substrate 2 has a positive unevenness UE2 at least at higher temperatures T and the carrier 3 is concavely curved in the region of the substrate mounting portion 32, the bottom side 2b and the substrate mounting portion 32 extend at least approximately parallel during the soldering-on process. The gives rise to a solder layer 4, after the soldering-on process, which has a comparatively homogeneous thickness compared to conventional methods.

Therefore, one aspect of the invention consists in using, for soldering onto a substrate mounting portion 32, only those insulation carriers 20 which, if they have the solidus temperature $T_S$ of the solder 4 later used for soldering-on, have an intrinsic positive unevenness UE2. In this context, "intrinsic" means that no external forces act on the insulating substrate 2.

During the course of a temperature cycle, the unevenness UE2 of an insulating substrate 2 changes. This is explained by way of example with reference to FIG. 5.

Figure 5:
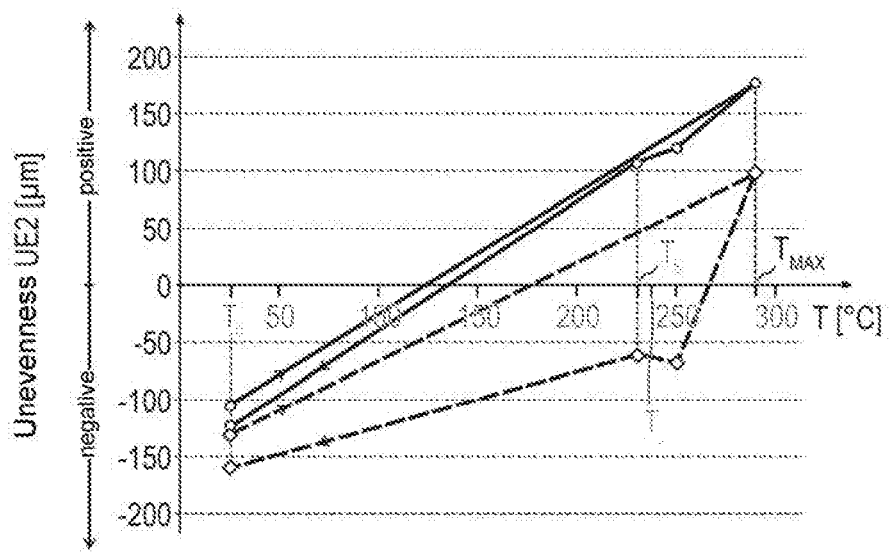

FIG. 5 shows a graph with a solid curve and a dashed curve. The two curves relate to different insulating substrates 2, which were each heated proceeding from an initial temperature T0 (e.g. room temperature 20° C.) which is lower than the solidus temperature $T_S$ of the predefined solder 4 until they reached a maximum temperature $T_{MAX}$, and were then cooled again to below the solidus temperature $T_S$ of the predefined solder 4. The running direction is specified in each case by arrowheads. In the case of the example shown, the insulating substrates 2 were each cooled again until they reached the initial temperature $T_0$.

Both insulating substrates 2 have an unevenness UE2<0 at the initial temperature $T_0$, i.e. they are concavely curved on the bottom side 2b—as shown in FIG. 1. As the temperature T increases, so too does the unevenness UE2, the negative unevenness UE2 which is initially present changing into a positive unevenness UE2, this being the case at approximately 120° C. in the case of the solid curve and at approximately 175° C. in the case of the dashed curve. The unevenness UE2 increases further until the maximum temperature $T_{MAX}$ is reached. As a whole, during the heating from the initial temperature $T_0$ until the maximum temperature $T_{MAX}$ is reached, the value of the unevenness UE2 increases continuously. After the maximum temperature $T_{MAX}$ has been reached, the insulating substrates 2 are cooled again to below the solidus temperature $T_S$ of the predefined solder 4, for example to the initial temperature $T_0$.

When an insulating substrate 2 is subjected to a temperature cycle for the first time, i.e. a first heating operation proceeding from an initial temperature $T_0$ up to the maximum temperature $T_{MAX}$ and then a first cooling operation proceeding from the maximum temperature $T_{MAX}$ down to a point at which the solidus temperature $T_S$ of the solder 4 is undershot, for example down to the initial temperature $T_0$, the curve progression of the first heating operation (i.e. the progression of the unevenness UE2 depending on the temperature) can differ considerably from the curve progression of the first cooling operation. In any further temperature cycle (same initial temperatures T0 and same maximum temperatures $T_{MAX}$ assumed), the curve progression of the heating operation and the curve progression of the cooling operation of said temperature cycle differ from one another to a lesser extent than is the case during the first temperature cycle of the insulating substrate 2 in question.

As the inventors of the present invention have determined, the curve progressions of the further temperature cycles (i.e. of the second and all further temperature cycles with the same initial temperatures T0 and maximum temperatures $T_{MAX}$) resemble the curve progression of the first cooling operation in a good approximation. It is therefore possible to use the curve progression of the first or of a further cooling operation to assess whether an insulating substrate 2 can be soldered with a carrier 3 with a high-quality soldered connection being formed.

Accordingly, one aspect of the invention consists in selecting an insulating substrate 2 suitable for soldering with a carrier 3 based on a criterion which indicates that the insulating substrate 2, if it has the solidus temperature of the solder 4, has a positive unevenness UE2.

Figure 6:
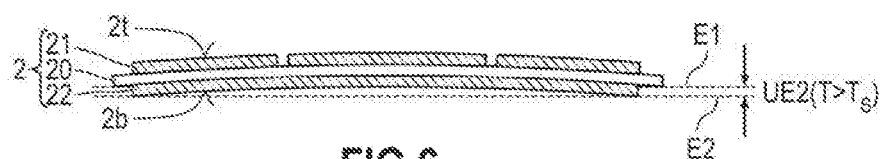
FIG. 6 shows a cross section through an insulating substrate which has a negative unevenness and is rejected.

In the simplest case, this can be effected in that a specific insulating substrate 2 is selected, heated proceeding from the initial temperature T0 up to the maximum temperature $T_{MAX}$ and then cooled again at least until the solidus temperature $T_S$ of the predefined solder 4 (i.e. of the solder 4 later used for soldering the insulating substrate 2 with the carrier 3) is reached. If it is determined in the process that the insulating substrate 2, when it reaches the solidus temperature $T_S$ of the predefined solder 4 during the cooling, has a positive unevenness UE2, it is suitable for soldering with the carrier 3. If the unevenness UE2, on the other hand, is equal to zero or negative when the solidus temperature $T_S$ is reached, the insulating substrate 2 is not suitable for soldering with the carrier 3 and is rejected. One example of such an insulating substrate 2 is shown in FIG. 6. In FIG. 5, the solid curve shows a suitable insulating substrate 2, since it has a positive unevenness UE2 (in the example slightly more than 100 µm) during the cooling when the solidus temperature $T_S$ of the solder 4 is reached. The dashed curve, by contrast, shows an unsuitable insulating substrate 2 which is therefore to be rejected, since it has a negative unevenness UE2 (in the example approximately −60 µm, i.e. minus 60 µm) during the cooling when the solidus temperature $T_S$ of the solder 4 is reached.

As the inventors of the present invention have furthermore determined, insulating substrates 2 which have an identical structure and are derived from the same production batch, i.e. in the case of which the upper and if appropriate the lower metalization layer 21 and 22 have been applied simultaneously to the insulation carrier 20 in question in the same process and the same process environment, exhibit similar progressions of the unevenness UE2 depending on the temperature T. Therefore, a further possibility includes selecting an insulating substrate 2 from a production batch of identical insulating substrates 2 as being suitable for soldering with a carrier 3, insofar as, in the case of a sample comprising a number of N sample insulating substrates from the production batch, it has been determined for each of the N sample insulating substrates that the sample insulating substrate, if it is heated proceeding from the initial temperature $T_0$ which is lower than the solidus temperature $T_S$ of the predefined solder 4 up to a predefined maximum temperature $T_{MAX}$ which is higher than the liquidus temperature $T_L$ of the solder 4, and then cooled, such that it reaches the solidus temperature $T_S$ of the solder 4 again, has a positive unevenness UE2 when the solidus temperature $T_S$ of the solder 4 is reached again. Expressed differently, all insulating substrates 2 from a production batch are considered to be suitable for soldering with a carrier 3 if, from a sample comprising N insulating substrates 2 from the production batch, each insulating substrate 2 of the sample is subjected to a temperature cycle as explained above, and if it is determined in the process that each of the insulating substrates 2 of the sample is suitable for soldering with a carrier 3, N in this case can be equal to 1, greater than or equal to 1, greater than or equal to 2, greater than or equal to 3, etc.

As an alternative or in addition, N can be at least one tenth of the number of insulating substrates 2 of the production batch.

If it has been determined that an insulating substrate 2 is suitable for soldering with a carrier 3, it can be soldered with the carrier 3. In this case, the insulating substrate 2 may not be populated as it is being soldered with the carrier 3 using the predefined solder 4, or it may be populated with one or more electronic components before the soldering. FIGS. 1, 3 and 4 schematically show an electronic component 1 illustrated by dashed lines, for example a diode, or a controllable semiconductor switch such as, e.g., an IGBT (Insulated Gate Bipolar Transistor), a MOSFET (Metal Oxide Semiconductor Field Effect Transistor), a JFET (Junction Field Effect Transistor), a thyristor. All of the examples mentioned may also involve, in particular, what is termed a vertical component, which is electrically conductively connected to a portion of the upper metalization layer 21 on its bottom side facing toward the insulating substrate 2 (e.g, by means of a soldered, a sintered or an adhesive connection). Furthermore, a vertical component of this type may be electrically conductively connected in any desired way on its top side remote from the insulating substrate 2, and for example may be electrically conductively connected to a further portion of the upper metalization layer 21 or another component of the semiconductor module. FIGS. 1, 3 and 4 in this respect schematically show a bonding wire connection, in which a bonding wire 8 is bonded by wire bonding at a bonding location directly to a metalization on the top side of the component 1, and also at a further bonding location directly to the further portion of the upper metalization layer 21. Ultrasonic wire bonding is suitable in particular as the wire bonding method.

All of the methods explained above can optionally be carried out taking one or more of the following criteria into account:

(a) During the soldering, the solder 4 can be heated up to the predefined maximum temperature $T_{MAX}$.

(b) The predefined maximum temperature $T_{MAX}$ can be at least 190° C.

(c) The solidus temperature TS of the solder 4 can be at least 180° C., and/or lower than or equal to 350° C.

(d) The thickness of the upper metalization layer 21 can be at least 0.15 mm, and/or smaller than or equal to 1.50 mm.

(e) The thickness of the lower metalization layer 22, if present, can be at least 0.15 mm, and/or smaller than or equal to 1.50 mm.

(f) The thickness of the insulation carrier 20 can be at least 0.2 mm, and/or smaller than or equal to 1.5 mm.

(g) The thickness of the carrier 3 can be at least 2 mm, and/or smaller than or equal to 5 mm.

(h) The bottom side 2b of an insulating substrate 2 suitable for soldering with the carrier 3, if it is cooled proceeding from the maximum temperature $T_{MAX}$ to the solidus temperature $T_S$ of the solder 4, can have a positive unevenness UE2 of at least 10 μm when the solidus temperature $T_S$ of the solder 4 is reached.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for soldering an insulating substrate onto a substrate mounting portion of a carrier by a predefined solder, wherein the insulating substrate comprises a dielectric insulation carrier, a top side, and a bottom side opposite to the top side, the method comprising:

selecting the insulating substrate based on a criterion which indicates that the insulating substrate having the solidus temperature of the solder, has a positive unevenness;

soldering the insulating substrate on the bottom side to the substrate mounting portion, such that, after the soldering, the solidified solder extends continuously from the bottom side of the insulating substrate as far as the substrate mounting portion; and populating the top side of the insulating substrate with at least one semiconductor chip, wherein the criterion indicates that when the insulating substrate is heated proceeding from an initial temperature which is lower than the solidus temperature of the solder up to a predefined maximum temperature which is higher than the liquidus temperature of the solder, and then cooled to the solidus temperature of the solder, such that the insulating substrate has a positive unevenness when the solidus temperature of the solder is reached again.

2. The method of claim 1, wherein the positive unevenness, which the insulating substrate has when the solidus temperature of the solder is reached again, is at least 10 μm.

3. The method of claim 1, wherein the solder is heated up to the predefined maximum temperature during the soldering.

4. The method of claim 1, wherein the predefined maximum temperature is at least 400° C.

5. The method of claim 1, wherein the criterion further indicates that the insulating substrate is selected from a production batch of identical insulating substrates such that in a sample from the production batch which comprises N sample insulating substrates, when each of the N sample insulating substrates is heated proceeding from the initial temperature which is lower than the solidus temperature of the solder up to the predefined maximum temperature which is higher than the liquidus temperature of the solder, and then cooled to the solidus temperature of the solder, such that each of the N sample insulating substrates has a positive unevenness when the solidus temperature of the solder is reached again.

6. The method of claim 5, wherein the positive unevenness, which the insulating substrate has when the solidus temperature of the solder is reached again, is at least 10 μm.

7. The method of claim 5, wherein the solder is heated up to the predefined maximum temperature during the soldering.

8. The method of claim 5, wherein the predefined maximum temperature is at least 400° C.

9. The method of claim 1, wherein the substrate mounting portion has an area of at least 6 cm$^2$, and wherein the solder solidified after the soldering is adjacent an entire surface of the substrate mounting portion.

10. The method of claim 1, wherein the insulation carrier comprises a ceramic.

11. The method of claim 1, wherein the insulating substrate comprises an upper metalization layer applied to the insulation carrier, and wherein a side of the upper metallization layer which is remote from the insulation carrier forms the top side of the insulation carrier.

12. The method of claim 1, wherein the insulating substrate comprises a lower metalization layer applied to the insulation carrier, and wherein a side of the lower metallization layer which is remote from the insulation carrier forms the bottom side of the insulation carrier.

13. The method of claim 1, wherein the insulation carrier comprises an aluminum oxide, wherein the insulating substrate comprises an upper metalization layer of copper connected directly to the insulation carrier, wherein a side of the upper metallization layer which is remote from the insulation carrier forms the top side of the insulation carrier, wherein the insulating substrate comprises a lower metalization layer of copper connected directly to the insulation carrier, and wherein a side of the lower metallization layer which is remote from the insulation carrier forms the bottom side of the insulation carrier.

14. The method of claim 1, wherein the carrier is concavely curved in a region of the substrate mounting portion.

* * * * *